United States Patent
Xie et al.

(10) Patent No.: US 12,091,750 B2
(45) Date of Patent: Sep. 17, 2024

(54) WAVE-ABSORBING MATERIAL POWDER WITH OXIDATION RESISTANCE AND SALT FOG RESISTANCE AND PREPARATION METHOD THEREOF

(71) Applicant: BattFlex (Wuhan) Technology Co., Ltd., Hubei (CN)

(72) Inventors: Ming Xie, Hubei (CN); Zhide Wang, Hubei (CN); Yuyu Li, Hubei (CN); Youwei Zhang, Hubei (CN); Pinggui Liu, Hubei (CN); Fan Qian, Hubei (CN)

(73) Assignee: BattFlex (Wuhan) Technology Co., Ltd., Hubei (CN)

( * ) Notice: Subject to any disclaimer, the term of this patent is extended or adjusted under 35 U.S.C. 154(b) by 29 days.

(21) Appl. No.: 17/994,170

(22) Filed: Nov. 25, 2022

(65) Prior Publication Data
US 2023/0087932 A1    Mar. 23, 2023

(30) Foreign Application Priority Data
Jun. 21, 2022    (CN) .......................... 202210705414.9

(51) Int. Cl.
| | | |
|---|---|---|
| *C23C 16/44* | (2006.01) | |
| *C23C 16/30* | (2006.01) | |
| *C23C 16/455* | (2006.01) | |
| *H05K 9/00* | (2006.01) | |

(52) U.S. Cl.
CPC .......... *C23C 16/4417* (2013.01); *C23C 16/30* (2013.01); *C23C 16/45531* (2013.01); *H05K 9/0083* (2013.01)

(58) Field of Classification Search
CPC . C23C 16/0272; C23C 16/0281; C23C 16/06; C23C 16/30; C23C 16/40; C23C 16/403; C23C 16/404; C23C 16/405; C23C 16/406; C23C 16/407; C23C 16/44; C23C 16/4417; C23C 16/442; C23C 16/45525; C23C 16/45527; C23C 16/45529; C23C 16/45531; C23C 16/45553; C23C 16/45555; C23C 16/45557; C23C 16/458; C23C 15/56
See application file for complete search history.

(56) References Cited

FOREIGN PATENT DOCUMENTS

| | | | | |
|---|---|---|---|---|
| CN | 106399968 A | * | 2/2017 | ............. C23C 16/40 |
| WO | WO-2012060776 A1 | * | 5/2012 | ............. B05D 3/207 |
| WO | WO-2022243246 A1 | * | 11/2022 | ............. A61L 27/30 |

* cited by examiner

*Primary Examiner* — William P Fletcher, III

(57) ABSTRACT

Wave-absorbing material powder of the present invention has oxidation resistance and salt fog resistance, which includes an iron-containing wave-absorbing material powder, and a metal oxide ceramic layer and a metal phosphate layer sequentially coated on an outside of the iron-containing wave-absorbing material powder from the inside to the outside. A method for preparing the wave-absorbing material powder includes using atomic layer deposition to coat the iron-containing wave absorbing material powder with a metal oxide ceramic coating, and then adopting the atomic layer deposition to coat the metal oxide ceramic coating with a metal phosphate layer; repeating the above steps to form an alternating nano-stack of the metal oxide ceramic coating and the metal phosphate layer outside the iron-containing absorbing material powder; and finally performing a high-temperature annealing treatment. The present invention improves temperature resistance, corrosion resistance and oxidation resistance of wave-absorbing materials.

12 Claims, 9 Drawing Sheets the embodiments 3     the embodiments 2     the embodiments 4 the uncoated original wave-absorbing material     the wave-absorbing material with the single-layer $ZrO_2$ coating     the wave-absorbing material with the laminated coating

1

WAVE-ABSORBING MATERIAL POWDER WITH OXIDATION RESISTANCE AND SALT FOG RESISTANCE AND PREPARATION METHOD THEREOF

CROSS REFERENCE OF RELATED APPLICATION

The present invention claims priority under 35 U.S.C. 119(a-d) to CN 202210705414.9, filed Jun. 21, 2022.

BACKGROUND OF THE PRESENT INVENTION

Field of Invention

The present invention relates to coatings with high-temperature resistance, oxidation resistance, and acid and alkali salt fog corrosion resistance; and more particularly to wave-absorbing material powder with oxidation resistance and salt fog resistance, and a preparation method thereof.

Description of Related Arts

The wave-absorbing material refers to the material that can absorb the energy of electromagnetic waves projected on its surface. In engineering applications, the wave-absorbing material is required to have high absorption rate to electromagnetic waves in a wider frequency band, the wave-absorbing material is also required to have the properties of light weight, temperature resistance, moisture resistance, corrosion resistance and the like. According to the law that electromagnetic waves propagate from low magnetic permeability to high magnetic permeability in the medium, generally, the high-permeability wave-absorbing materials are used to guide the electromagnetic waves. Through resonance, a large amount of radiation energy of the electromagnetic waves is absorbed, and then the energy is converted into heat through coupling. Carbon materials such as graphene, carbon nanotubes, carbon fibers, carbon black and graphite are lightweight wave-absorbing materials with excellent dielectric properties. However, due to the large dielectric constant of carbon materials, the wave-absorbing layer alone is poor in impedance matching characteristics. As a result, shortcomings, such as single loss mechanism, narrow absorption frequency band, and weak absorption performance, limit the improvement of wave-absorbing performance. After the second phase of wave-absorbing materials is introduced into the carbon materials, the wave-absorbing properties can be improved since new multi-dimensional structures and multiple electromagnetic loss mechanisms are added. The second phase microwave absorbing materials include Fe/Co/Ni, Cu@Ni, ferrite and other magnetic metals and their oxides.

As a traditional magnetic metal material, carbonyl iron has been widely used in the field of commercial electromagnetic wave absorbing materials. Due to the high activity of metal ions, carbonyl iron is prone to oxidation with oxygen in the air, especially under a high temperature, which will inevitably reduce the wave-absorbing performance of carbonyl iron. Furthermore, carbonyl iron can be easily corroded in high humidity, salinity or acidic environment.

Coating wave-absorbing material powder with ceramics is an effective way to improve the anti-oxidation and anti-corrosion performance, which can also improve the interface bonding performance of the wave-absorbing material powder reinforced composite material. Conventionally, methods for preparing oxide ceramic coatings on the wave-absorbing material powder are mainly sol-gel method (Sol-Gel), chemical vapor deposition (CVD) and atomic layer deposition (ALD).

The sol-gel method uses the organic alkoxide or inorganic salt of a target element as the raw material to make a sol under certain conditions before dipping the absorbing material powder. After gelling due to the volatilization and polycondensation of the solvent, the wave-absorbing material are processed with drying and heat treatment to obtain an oxide ceramic coating thereon. For example, Baklanova et al. prepared a zirconia coating on the surface of Nicalon SiC fibers by using a stabilized cerium oxide sol (J. Eur. Ceram. Soc., 2006, 26:1725). However, the coating obtained by the sol-gel method is neither uniform nor dense, and shrinkage cracks and pores can be easily generated during the drying process. Due to repeated dipping, drying and heat treatments are used, which greatly increases the process complexity and the preparation cost. And the wave-absorbing materials tend to stick together after coating.

In chemical vapor deposition, several gaseous substances are transported to the surface of the heated material for chemical reaction, and the reactants are deposited on the surface of the reactants to form a coating. For example, Li et al. used $ZrCl_4$, $CO_2$ and $H_2$ as precursors to prepare $ZrO_2$ coatings on Hi-Nicalon SiC fibers through chemical vapor deposition (J. Am. Ceram. Soc., 2002, 85(6):1561). However, the chemical vapor deposition is complicated and usually requires a high temperature, which will deteriorate the mechanical properties of the fiber itself. At the same time, the reaction mechanism is complex, and the coating is prone to contain impurities. In addition, the waste gas treatment is difficult, and will lead to environment pollution.

In atomic layer deposition (ALD), gas-phase precursors are alternately pulsed into a reaction chamber, so as to be chemically adsorbed on the deposition substrate and react to form a deposited film, wherein the surface reaction is self-limiting. ALD has low deposition temperature, no particle contamination, low impurities, wide choice of reactants, precise thickness control, uniformity and consistency of deposition thickness, etc. Conventionally, Wang Jun et al. proposed coating the SiC fiber through ALD to achieve the effect of anti-oxidation. However, such method can only coat the fiber cloth composed of SiC fibers, and cannot perform atomic layer deposition coating in the form of powder, which severely limits the use of wave-absorbing materials.

According to Liu Yanfeng et al. "The Corrosion Resistance and Wave Absorption of Carbonyl Iron Powder Coated by Atomic Layer Deposition of Alumina", ALD method can grow nano-scale alumina film with good shape retention on the surface of carbonyl iron powder. After ALD cyclic coating, a relatively stable and dense aluminum oxide thin layer grows on the surface, which can prevent the oxidation reaction of oxygen and carbonyl iron to a certain extent. However, when the temperature reaches 400-550° C., the protective layer will be destroyed. At this time, the carbonyl iron powder will be rapidly oxidized. In the acid corrosion test, the aluminum oxide film grown by ALD has a relatively dense structure, which can prevent hydrogen ions from passing through the thin layer to a certain extent and weaken the reaction with carbonyl iron powder. However, the barrier of aluminum oxide to hydrogen ions is not lasting. Over time, the coating sample gradually dissolves and produces a very small amount of bubbles. After 15 h corrosion experiment, the hydrochloric acid solution of carbonyl iron powder circularly coated by ALD turns yellowish brown, which may be because the alumina prepared by ALD under the condition of lower than 400° C. belongs to the amorphous state, and the amorphous state alumina can react chemically with strong acids. When the coating is destroyed, the hydrochloric acid solution will also react with the carbonyl iron powder. After ALD cyclic coating of carbonyl iron powder by ALD, the magnetic reflectivity, magnetic loss and microwave absorption of carbonyl iron powder are reduced. Chinese patent application CN20211095624.2 illustrates that when the atomic layer deposition technology is directly applied, the precipitated product has an amorphous structure. By controlling the microstructure (such as crystallinity, etc.) of metal oxide films through tempering treatment, a film layer with a crystal structure can be obtained. Chinese patent application CN201610665560.8 taught that ALD method can grow metal oxide ceramic coating on the surface of wave absorbing material powder, wherein the non-oxygen elements in the metal oxide ceramic coating are aluminum, hafnium, yttrium, zirconium, titanium, zinc or silicon. The absorbing material powder is carbonyl iron, carbonyl nickel, carbonyl cobalt, silicon carbide, iron silicon aluminum, or metal powder that can be used as an absorbing material.

SUMMARY OF THE PRESENT INVENTION

An object of the present invention is to provide wave-absorbing material powder with oxidation resistance and salt fog resistance, and a preparation method thereof. The present invention not only solves the problems that the wave-absorbing material is not resistant to high temperature, corrosion and oxidation, but also improves the absorbing performance of the wave-absorbing material powder by introducing dielectric materials and adjusting electromagnetic parameters.

Accordingly, in order to accomplish the above objects, the present invention provides a method for preparing wave-absorbing material powder with oxidation resistance and salt fog resistance, comprising steps of:
- step 1: putting iron-containing wave-absorbing material powder into a porous container; wherein a wave-absorbing material comprises carbonyl iron, iron-silicon-aluminum, and iron-cobalt; and the iron-containing wave-absorbing material powder is particles, flakes or chopped fibers;
- step 2: putting the porous container into an ALD (atomic layer deposition) reaction chamber; then repeatedly vacuumizing, and filling in nitrogen gas at least three times;
- step 3: using atomic layer deposition to coat the iron-containing wave-absorbing material powder with a metal oxide ceramic coating, wherein a non-oxygen element in the metal oxide ceramic coating is aluminum, hafnium, yttrium, zirconium, titanium, zinc or silicon;
- step 4: repeating the step 3 until a predetermined coating thickness is deposited;
- step 5: fluidizing powder obtained from the step 4 under nitrogen or argon atmosphere, wherein a fluidization pressure is 1-1000 torr; or rotating the porous container to disperse the powder;
- step 6: selecting a precursor according to a type of a deposited ceramic coating, and setting parameters of the ALD reaction chamber as: a deposition temperature is 100° C.-400° C., and a deposition pressure is 0.01 torr-500 torr; wherein the precursor is volatile trimethylaluminum, $Ti(OEt)_4$, $Zr[N(CH_3)_2]_4$, or $Hf[N(CH_3)(C_2H_5)]_4$;
- step 7: introducing precursor vapor into the ALD reaction chamber with nitrogen or argon, and holding for 10-300 seconds;
- step 8: purging the ALD reaction chamber with nitrogen or argon to remove residual precursor;
- step 9: introducing dimethyl phosphate vapor into the ALD reaction chamber with nitrogen or argon, and holding for 10-300 seconds;
- step 10: purging the ALD reaction chamber with nitrogen or argon to remove an excess dimethyl phosphate vapor oxygen source and by-products;
- step 11: repeating the steps 5-10 until a predetermined thickness of a metal phosphate coating is deposited, wherein the metal phosphate coating is $AlPO_4$, $Ti_3(PO_4)_4$, $Zr(HPO_4)_2$, or $Hf_3(PO_4)_4$; and
- step 12: sintering obtained powder at 600-900° C. under argon atmosphere.

Preferably, the method further comprises a step between the step 11 and the step 12: repeating the steps 3-10 to form alternating nano-stack layers composed of the metal oxide ceramic coating and $AlPO_4$, $Ti_3(PO_4)_4$, $Zr(HPO_4)_2$, or $Hf_3(PO_4)_4$.

Preferably, the step 3 comprises specific steps of:
- Step 31: fluidizing the iron-containing wave-absorbing material powder in nitrogen or argon atmosphere, wherein a fluidization pressure is 1-1000 torr; or rotating the porous container to disperse the iron-containing wave-absorbing material powder;
- step 32: selecting a precursor according to a type of a deposited oxide coating, and setting the parameters of the ALD reaction chamber as: the deposition temperature is 25° C.-400° C., and the deposition pressure is 0.01 torr-500 torr;
- step 33: introducing precursor vapor into the ALD reaction chamber with nitrogen or argon, and holding for 10-300 seconds;
- step 34: purging the ALD reaction chamber with nitrogen or argon to remove residual precursor;
- step 35: introducing oxygen source vapor into the ALD reaction chamber with nitrogen or argon, and holding for 10-300 seconds; and
- step 36: purging the ALD reaction chamber with nitrogen or argon to remove an excess oxygen source and by-products.

Preferably, the precursor in the step 3 is selected from a group consisting of volatile silicon ions, metal alkylamino salts, metal organic compounds, halides, alkoxides, and metal β-diketone complexes; and metal ions in the metal alkylamino salts, the metal organic compounds, the halides, the alkoxides, and the metal β-diketone complexes are aluminum, hafnium, yttrium, zirconium, titanium, and zinc ions.

Preferably, the oxygen source is water, hydrogen peroxide, oxygen, ozone, or atomic oxygen.

Preferably, a carrying gas flow rate in the step 7 and the step 9 is 5-8000 sccm; and a purging gas flow rate in the step 8 and the step 9 is 10-5000 sccm. Or, a carrying gas flow rate in the step 33 and the step 35 is 5-8000 sccm; and a purging gas flow rate in the step 34 and the step 36 is 10-5000 sccm.

Preferably, the fluidization pressure in the step 3 and the step 5 is 1-1000 torr.

The present invention also provides wave-absorbing material powder with oxidation resistance and salt fog resistance prepared by the above method, comprising: iron-containing wave absorbing material powder, and a coating on the iron-containing wave absorbing material powder, wherein the coating is composed of multiple alternating metal oxide ceramic coatings and metal phosphate coatings; a non-oxygen element in the metal oxide ceramic coating is aluminum, hafnium, yttrium, zirconium, titanium, zinc or silicon, and the metal phosphate coating is $AlPO_4$, $Ti_3(PO_4)_4$, $Zr(HPO_4)_2$, or $Hf_3(PO_4)_4$; the coating is a film layer with a crystalline structure.

Compared with the conventional sol-gel method, the present invention has the following advantages: the coating layer is transformed into a more compact crystal form after high-temperature annealing treatment, has better ion isolation effect, and is uniform and dense; cracks, pores and other defects are few in the nano-lamination, pores and other defects are less, leading to sufficient ion penetration barrier effect; thickness of nano-lamination can be precisely controlled, and the number and type of laminated layers can be controlled; high temperature treatment causes iron to precipitate to the surface layer, but still under the coating layer. If there is no dense coating, it is more susceptible to oxidation. The advantage of iron precipitation is that the magnetic reflectivity of the wave-absorbing material powder is improved, and the wave absorption performance of the wave-absorbing material powder is better. According to the present invention, the operation is simple and the repeatability is good.

Compared with the conventional chemical vapor deposition method, the present invention has the following advantages: the deposition temperature is low, and the damage to the powder is small; the reaction mechanism is simple, and there are few coating impurities; the multi-component and mixed oxide coatings are easy to deposit; the coating is more uniform, and the thickness control is more accurate; the operation is simple, and there is no need to control the uniformity of the reactant flow; the exhaust gas is easy to handle, and the environmental pollution is small.

Compared with the conventional atomic layer deposition method, the present invention has the following advantages: it can coat micron or even nano-scale powder, and can coat several kilograms to several hundred kilograms each time.

The present invention can prepare a nano-scale ceramic laminate with uniform, dense, less impurities and precisely controllable thickness on the surface of the wave-absorbing material powder. It is difficult for oxygen molecules and chloride ions in the salt fog to pass through the coating layer from the grain boundary, so as to delay oxidation and corrosion. While improving the oxidation resistance and corrosion resistance of the wave-absorbing material powder, the present invention also improves the electromagnetic properties of the absorbing material.

DETAILED DESCRIPTION OF THE PREFERRED EMBODIMENT

Figure 1:
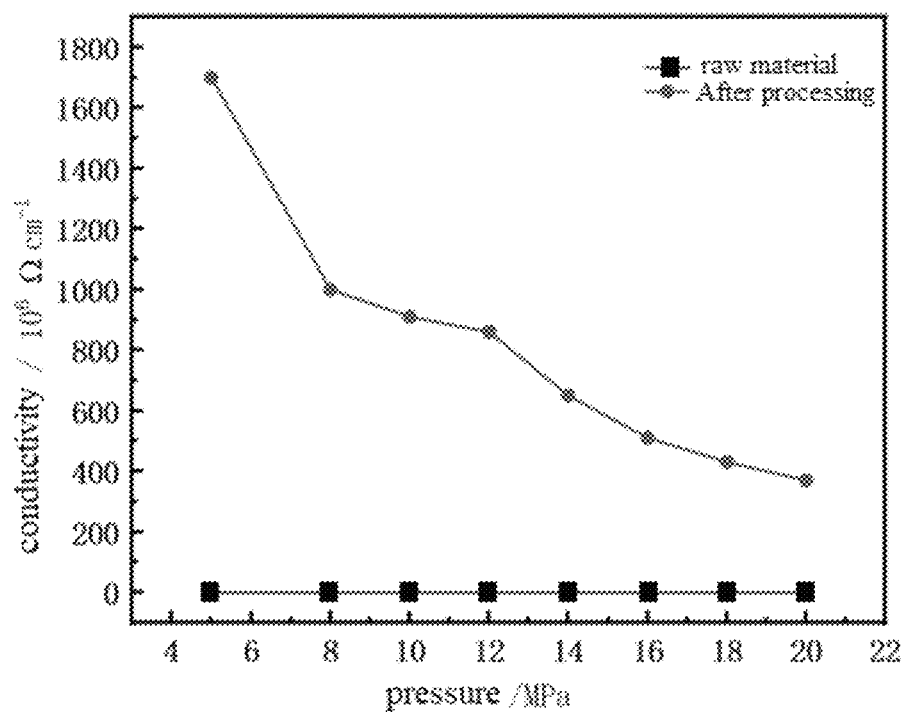
FIG. 1 illustrates resistivity of wave-absorbing powder material powder before and after using an anti-corrosion coating of the present invention.

Referring to the drawings, the present invention will be further illustrated. Embodiments of the present invention are implemented based on the technical scheme of the present invention, which are described in detail. However, the protection scope of the present invention is not limited to the following embodiments.

A method for preparing wave-absorbing material powder with oxidation resistance and salt fog resistance, comprises steps of step 1: putting wave-absorbing material powder into a porous container; wherein a wave-absorbing material comprises carbonyl iron, nickel carbonyl, cobalt carbonyl, metal powder, silicon carbide, iron silicon aluminum, iron cobalt, or metal powder that can be used as a wave-absorbing material; and the iron-containing wave-absorbing material powder is particles, flakes or chopped fibers;

step 2: putting the porous container into an ALD (atomic layer deposition) reaction chamber; then repeatedly vacuumizing, and filling in nitrogen gas at least three times;

Step 3: fluidizing the iron-containing wave-absorbing material powder in nitrogen or argon atmosphere, wherein a fluidization pressure is 1-1000 torr; or rotating the porous container to disperse the iron-containing wave-absorbing material powder; wherein the fluidization pressure is preferably 10-100 torr;

step 4: selecting a precursor according to a type of a deposited ceramic coating, and setting the parameters of the ALD reaction chamber as: the deposition temperature is 100° C.-400° C., and the deposition pressure is 0.01 torr-500 torr; the precursor is selected from a group consisting of volatile silicon ions, metal alkylamino salts, metal organic compounds, halides, alkoxides, and metal β-diketone complexes; and metal ions in the metal alkylamino salts, the metal organic compounds, the halides, the alkoxides, and the metal β-diketone complexes are aluminum, hafnium, yttrium, zirconium, titanium, and zinc ions;

step 5: introducing precursor vapor into the ALD reaction chamber with nitrogen or argon, and holding for 10-300 seconds;

step 6: purging the ALD reaction chamber with nitrogen or argon to remove residual precursor;

step 7: introducing oxygen source vapor into the ALD reaction chamber with nitrogen or argon, and holding for 10-300 seconds; wherein the oxygen source is water, hydrogen peroxide, oxygen, ozone, or atomic oxygen;

step 8: purging the ALD reaction chamber with nitrogen or argon to remove an excess oxygen source and by-products;

step 9: repeating the steps 5-8 until a predetermined coating thickness is deposited, so as to obtain wave-absorbing powder with an atomic layer deposition oxide coating; and step 10: choosing another deposit and repeating the steps 3-8 until a predetermined coating thickness is deposited, wherein the other deposit is metal phosphate, and a precursor thereof is volatile trimethylaluminum and dimethyl phosphate; the obtained powder is subjected to high-temperature annealing treatment in argon atmosphere at 600-900° C. to obtain powder with an atomic layer deposition metal phosphate coating;

wherein the step 10 comprises specific steps of:

step 101: fluidizing the iron-containing wave-absorbing material powder in nitrogen or argon atmosphere, wherein a fluidization pressure is 1-1000 torr; or rotating the porous container to disperse the iron-containing wave-absorbing material powder; wherein the fluidization pressure is preferably 10-100 torr;

step 102: selecting a precursor according to a type of a deposited ceramic coating, and setting parameters of the ALD reaction chamber as: a deposition temperature is 100° C.-400° C., and a deposition pressure is 0.01 torr-500 torr; wherein the precursor is volatile $Ti(OEt)_4$, $Zr[N(CH_3)_2]_4$, or $Hf[N(CH_3)(C_2H_5)]_4$;

step 103: introducing precursor vapor into the ALD reaction chamber with nitrogen or argon, and holding for 10-300 seconds;

step 104: purging the ALD reaction chamber with nitrogen or argon to remove residual precursor;

step 105: introducing dimethyl phosphate vapor into the ALD reaction chamber with nitrogen or argon, and holding for 10-300 seconds;

step 106: purging the ALD reaction chamber with nitrogen or argon to remove an excess dimethyl phosphate vapor oxygen source and by-products; and step 107: repeating the step 10 until a predetermined thickness of the $AlPO_4$, $Ti_3(PO_4)_4$, $Zr(HPO_4)_2$, or $Hf_3(PO_4)_4$ coating is deposited.

The powder with the atomic layer deposition metal phosphate coating obtained in the step 10 comprises iron-containing wave absorbing material powder, and a coating on the iron-containing wave absorbing material powder, wherein the coating is composed of multiple alternating metal oxide ceramic coatings and metal phosphate coatings; a non-oxygen element in the metal oxide ceramic coating is aluminum, hafnium, yttrium, zirconium, titanium, zinc or silicon, and the metal phosphate coating is $AlPO_4$, $Ti_3(PO_4)_4$, $Zr(HPO_4)_2$, or $Hf_3(PO_4)_4$; the coating is a film layer with a crystalline structure.

Embodiment 1

The embodiment 1 comprises the following steps of:

(1) putting iron-cobalt powder into a porous container with micropore size;

(2) putting the porous container into an ALD reaction chamber, then repeatedly vacuumizing, and filling in nitrogen gas three times; heating the reaction chamber to 200° C., and maintaining a pressure of the reaction chamber at 5 torr;

(3) rotating the porous container so that the powder is fully mixed in the porous container;

(4) pulsing a precursor $Zr[N(CH_3)_2]_4$ into the reaction chamber with $N_2$ at a flow rate of 50 sccm, adsorbing on the iron-cobalt powder until 6 torr, and keeping for 60 seconds; purging with 50 sccm $N_2$ for 30s and removing residual $Zr[N(CH_3)_2]_4$; then purging $H_2O$ into the reaction chamber with 50 sccm $N_2$ until the gas pressure reaches 6 torr, and keeping for 60 seconds to chemically reacts with the $Zr[N(CH_3)_2]_4$ adsorbed on the iron-cobalt powder, thereby generating $ZrO_2$ for 60s; and then purging with 50 sccm $N_2$ to remove excess water and by-products for 30s, thus completing an ALD deposition cycle;

(5) repeating the step (4) 10 times to obtain iron-cobalt powder with a 1 nm-thick $ZrO_2$ coating layer;

(6) rotating the porous container again, so that the iron-cobalt powder with the $ZrO_2$ coating is fully mixed in the porous cavity;

(7) pulsing a precursor trimethylaluminum vapor into the reaction chamber with $N_2$ at a flow rate of 50 sccm, adsorbing on the $ZrO_2$ coating layer of the powder obtained in the step (5) until 6 torr, and keeping for 60 seconds; purging with 50 sccm $N_2$ for 30s and removing residual trimethylaluminum; then purging dimethyl phosphate into the reaction chamber with 50 sccm $N_2$ until the gas pressure reaches 6 torr, and keeping for 60 seconds to chemically reacts with the trimethylaluminum adsorbed on the $ZrO_2$ coating layer, thereby generating $AlPO_4$ for 60s; and then purging with 50 sccm $N_2$ to remove excess dimethyl phosphate and by-products for 30s, thus completing an ALD deposition cycle;

(8) repeating the steps (6)-(7) 10 times, so that a coating thickness is 1 nm, thereby complete a nano-stack, wherein phosphates are more resistant to water and acid corrosion; when different coatings of $ZrO_2$ and $AlPO_4$ are formed, discontinuous and mismatched characteristics of their grain boundaries can be used to more efficiently block oxygen and ions.

(9) repeating the steps (3)-(8) 5 times to form a nano-stack composed of $ZrO_2$ and $AlPO_4$ with a total thickness of 10 nm; wherein after multiple repetitions, the coating thickness increases to provide better oxidation and corrosion resistance; and (10) processing the powder obtained in the step (9) in argon atmosphere at 600° C. for 4 hours, so as to obtain a final product; and sintering at a high temperature to improve wave-absorbing performance.

The more the step (9) is repeated, the more the thickness will be, which means better oxidation and corrosion resistance, but the thicker it is, the worse the magnetic reflection will be. However, after the high-temperature annealing treatment in the step (10), iron elements are precipitated to the surface layer, so that the magnetic reflection is improved.

Figure 2:
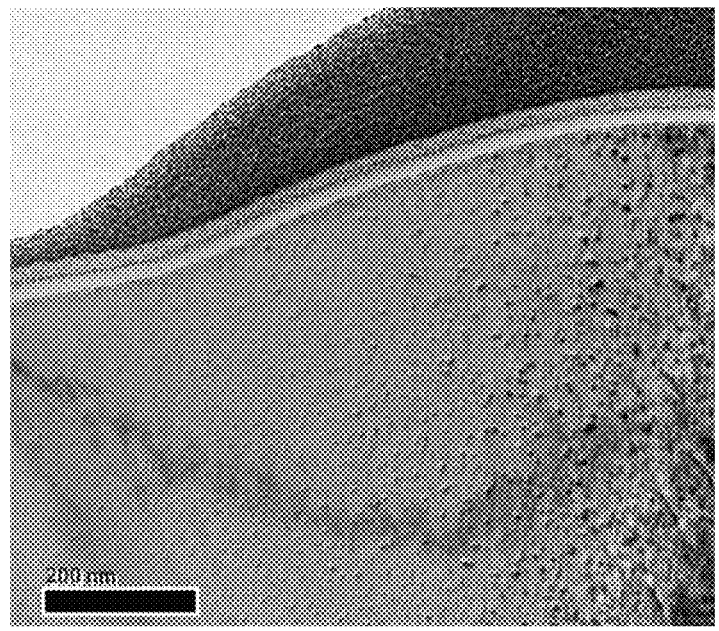
FIG. 2 is a cross-sectional electron microscope photo of a nano-laminate composed of $ZrO_2$ and $AlPO_4$ of the wave-absorbing material powder with oxidation resistance and salt fog resistance prepared in an embodiment.

The scanning electron microscope photo of the final product prepared in the embodiment 1 is shown in FIG. 2. $ZrO_2$ and $AlPO_4$ constitute a nano-stack, and each nano-coating layer is dense and uniform. FIG. 1 shows conductivities of the iron-cobalt powder and the powder obtained in the step (10). As the pressure during conductivity test increases, the conductivity of the coated iron-cobalt powder decreases when the nano ceramic layer coating the powder is dense, indicating the denser the coating layer, the lower the conductivity.

Embodiment 2

The embodiment 2 comprises the following steps of:
(1) putting carbonyl-iron powder into a porous container with micropore size;
(2) putting the porous container into an ALD reaction chamber, then repeatedly vacuumizing, and filling in nitrogen gas three times; heating the reaction chamber to 200° C., and maintaining a pressure of the reaction chamber at 5 torr;
(3) rotating the porous container so that the powder is fully mixed in the porous container;
(4) pulsing a precursor $Zr[N(CH_3)_2]_4$ into the reaction chamber with $N_2$ at a flow rate of 50 sccm, adsorbing on the carbonyl-iron powder until 6 torr, and keeping for 60 seconds; purging with 50 sccm $N_2$ for 30s and removing residual $Zr[N(CH_3)_2]_4$; then purging $H_2O$ into the reaction chamber with 50 sccm $N_2$ until the gas pressure reaches 6 torr, and keeping for 60 seconds to chemically reacts with the $Zr[N(CH_3)_2]_4$ adsorbed on the carbonyl-iron powder, thereby generating $ZrO_2$ for 60s; and then purging with 50 sccm $N_2$ to remove excess water and by-products for 30s, thus completing an ALD deposition cycle;
(5) repeating the step (4) 10 times to obtain carbonyl-iron powder with a 1 nm-thick $ZrO_2$ coating layer;
executing the steps (6)-(8) of the embodiment 1, using trimethylaluminum and dimethyl phosphate as precursors for $AlPO_4$ coating, thereby forming a nano-stack with a coating thickness of 1 nanometer; and
repeat the above steps to form 5 nano-stacks consisting of $ZrO_2$ and $AlPO_4$ with a total thickness of 10 nm; processing the powder in argon atmosphere at 300° C. for 4 hours to obtain the final product.

Embodiment 3

The embodiment 3 comprises the following steps of:
(1) putting carbonyl-iron powder into a porous container with micropore size;
(2) putting the porous container into an ALD reaction chamber, then repeatedly vacuumizing, and filling in nitrogen gas three times; heating the reaction chamber to 200° C., and maintaining a pressure of the reaction chamber at 5 torr;
(3) rotating the porous container so that the powder is fully mixed in the porous container;
(4) pulsing a precursor $Zr[N(CH_3)_2]_4$ into the reaction chamber with $N_2$ at a flow rate of 50 sccm, adsorbing on the carbonyl-iron powder until 6 torr, and keeping for 60 seconds; purging with 50 sccm $N_2$ for 30s and removing residual $Zr[N(CH_3)_2]_4$; then purging $H_2O$ into the reaction chamber with 50 sccm $N_2$ until the gas pressure reaches 6 torr, and keeping for 60 seconds to chemically reacts with the $Zr[N(CH_3)_2]_4$ adsorbed on the carbonyl-iron powder, thereby generating $ZrO_2$ for 60s; and then purging with 50 sccm $N_2$ to remove excess water and by-products for 30s, thus completing an ALD deposition cycle;
(5) repeating the step (4) 10 times to obtain carbonyl-iron powder with a 1 nm-thick $ZrO_2$ coating layer;
executing the steps (6)-(8) of the embodiment 1, using trimethylaluminum and dimethyl phosphate as precursors for $AlPO_4$ coating, thereby forming a nano-stack with a coating thickness of 1 nanometer; and
repeat the above steps to form 5 nano-stacks consisting of $ZrO_2$ and $AlPO_4$ with a total thickness of 10 nm.

Embodiment 4

The embodiment 4 comprises the following steps of:
(1) putting carbonyl-iron powder into a porous container with micropore size;
(2) putting the porous container into an ALD reaction chamber, then repeatedly vacuumizing, and filling in nitrogen gas three times; heating the reaction chamber to 200° C., and maintaining a pressure of the reaction chamber at 5 torr;
(3) rotating the porous container so that the powder is fully mixed in the porous container;
(4) pulsing a precursor $Zr[N(CH_3)_2]_4$ into the reaction chamber with $N_2$ at a flow rate of 50 sccm, adsorbing on the carbonyl-iron powder until 6 torr, and keeping for 60 seconds; purging with 50 sccm $N_2$ for 30s and removing residual $Zr[N(CH_3)_2]_4$; then purging $H_2O$ into the reaction chamber with 50 sccm $N_2$ until the gas pressure reaches 6 torr, and keeping for 60 seconds to chemically reacts with the $Zr[N(CH_3)_2]_4$ adsorbed on the carbonyl-iron powder, thereby generating $ZrO_2$ for 60s; and then purging with 50 sccm $N_2$ to remove excess water and by-products for 30s, thus completing an ALD deposition cycle;
(5) repeating the step (4) 10 times to obtain carbonyl-iron powder with a 1 nm-thick $ZrO_2$ coating layer;
(6) rotating the porous container again, so that the carbonyl-iron powder with the $ZrO_2$ coating is fully mixed in the porous cavity;
(7) pulsing a precursor trimethylaluminum vapor into the reaction chamber with $N_2$ at a flow rate of 50 sccm, adsorbing on the $ZrO_2$ coating layer of the powder obtained in the step (5) until 6 torr, and keeping for 60 seconds; purging with 50 sccm $N_2$ for 30s and removing residual trimethylaluminum; then purging dimethyl phosphate into the reaction chamber with 50 sccm $N_2$ until the gas pressure reaches 6 torr, and keeping for 60 seconds to chemically reacts with the trimethylaluminum adsorbed on the $ZrO_2$ coating layer, thereby generating $AlPO_4$ for 60s; and then purging with 50 sccm $N_2$ to remove excess dimethyl phosphate and by-products for 30s, thus completing an ALD deposition cycle;
(8) repeating the steps (6)-(7) 10 times, so that a coating thickness is 1 nm, thereby complete a nano-stack, wherein phosphates are more resistant to water and acid corrosion; when different coatings of $ZrO_2$ and $AlPO_4$ are formed, discontinuous and mismatched characteristics of their grain boundaries can be used to more efficiently block oxygen and ions.
(9) repeating the steps (3)-(8) 5 times to form a nano-stack composed of $ZrO_2$ and $AlPO_4$ with a total thickness of 10 nm; wherein after multiple repetitions, the coating thickness increases to provide better oxidation and corrosion resistance; and

(10) processing the powder obtained in the step (9) in argon atmosphere at 600° C. for 4 hours, so as to obtain a final product; and sintering at a high temperature to improve wave-absorbing performance.

The more repetitions of steps (3)-(8) in step (9), the greater the thickness of the nano layer, which means better oxidation and corrosion resistance, but the thicker it is, the worse the magnetic reflection will be. However, after the high-temperature annealing treatment in the step (10), iron elements are precipitated to the surface layer, so that the magnetic reflection is improved.

Figure 3:
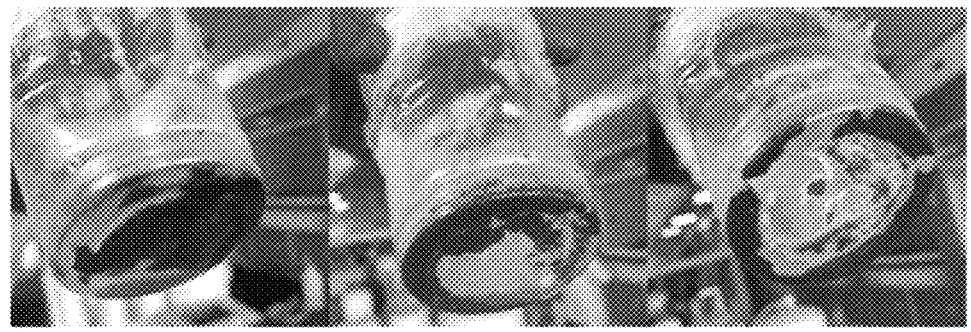
FIG. 3 is results of a corrosion test after soaking carbonyl iron powder of embodiments 2-4 in hydrochloric acid for three days.

In order to test the acidic corrosion resistance of carbonyl-iron powder t before and after coating, 0.8 g carbonyl-iron powder with no coating and carbonyl-iron with ALD cyclic coating obtained in the embodiments 4 and 2 were respectively weighed at room temperature. Powder samples were placed in 0.2 mol/L HCl solution and stirred quickly with a glass rod. As shown in FIG. 3, corrosion test was performed by immersing in salt water for three days. Severe discoloration occurred to the embodiment 3, while no discoloration occurred to the embodiments 2 and 4. Therefore, the anti-HCl corrosion resistance of the wave-absorbing materials with the lamination coating in the embodiments 4 and 2 is better than that of the wave-absorbing materials with a single-layer $ZrO_2$ coating in the prior art.

Figure 4:
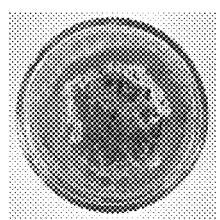
FIG. 4 is results of a neutral corrosion resistance test of original powder, an absorbent with a single-layer coating and an absorbent with a lamination coating.
Figure 4:
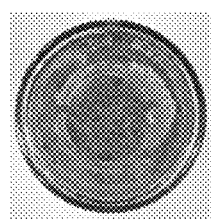
Figure 4:
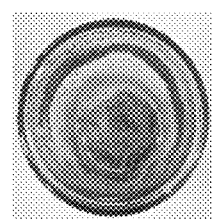

At the same time, neutral corrosion resistance test was carried out on the uncoated original wave-absorbing material, the wave-absorbing material with the single-layer $ZrO_2$ coating and the wave-absorbing material with the laminated coating. The results are shown in FIG. 4. After soaking in 5% salt water for 24 hours, the original iron powder turned yellow obviously, while the coated powder showed no obvious corrosion.

Figure 5:
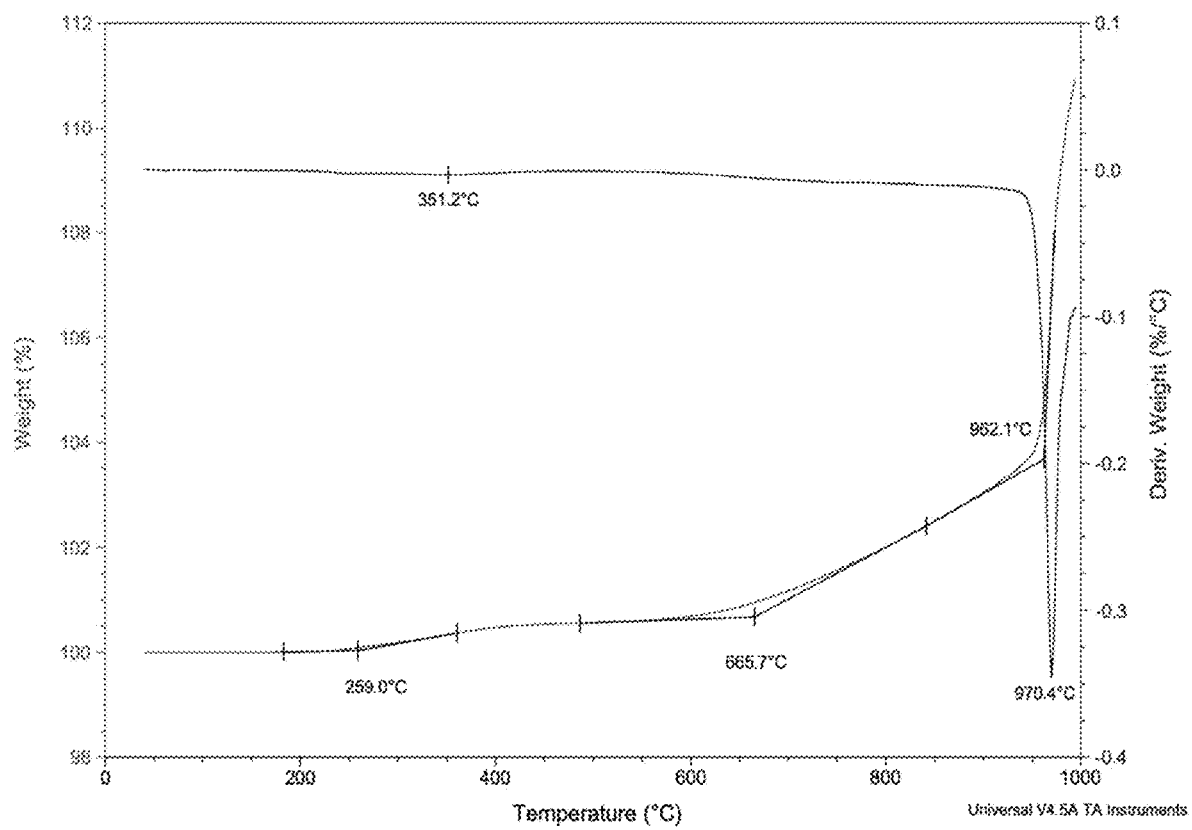
FIG. 5 is a TGA diagram of the original powder (an oxidation temperature is 665.7° C.)

In addition, TGA test was carried out on the original wave-absorbing material, the wave-absorbing material with the single-layer coating and the wave-absorbing material with the laminated coating. Referring to FIG. 5, the results show that the uncoated wave-absorbing material suffered thermal oxidation with a temperature higher than 665.7° C. due high-temperature oxidation, and the carbonyl-iron powder was oxidized to $Fe_2O_3$ or $Fe_3O_4$. The thermal gravity of the wave-absorbing material increased significantly.

As shown in FIG. 5, after the single-layer coating of the present invention, the increment of thermal gravity of the wave-absorbing material was reduced, and the thermal oxidation temperature increased to 694.9° C.

Figure 7:
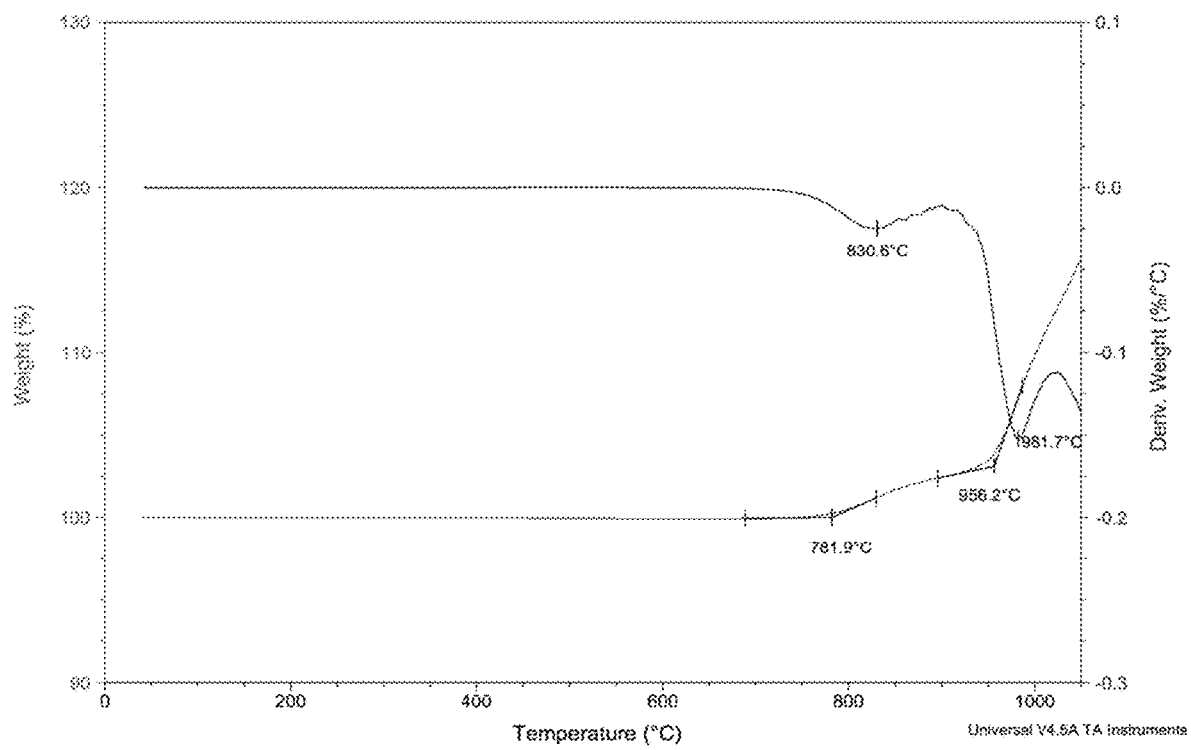
FIG. 7 is a TGA diagram of the absorbent with the lamination coating (an oxidation temperature is 781.9° C.)
Figure 8:
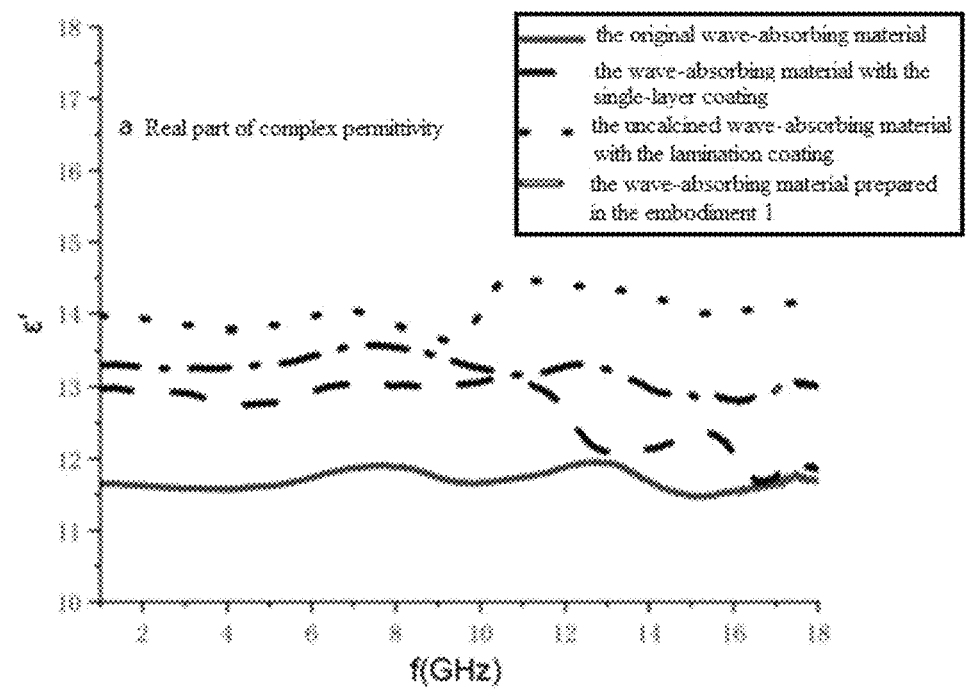
FIG. 8 is a curve of real parts of electromagnetic parameter: complex permittivity of the original powder, the absorbent with the single-layer coating, an uncalcined absorbent with the laminating coating, and an absorbent prepared in the embodiment 1.
Figure 9:
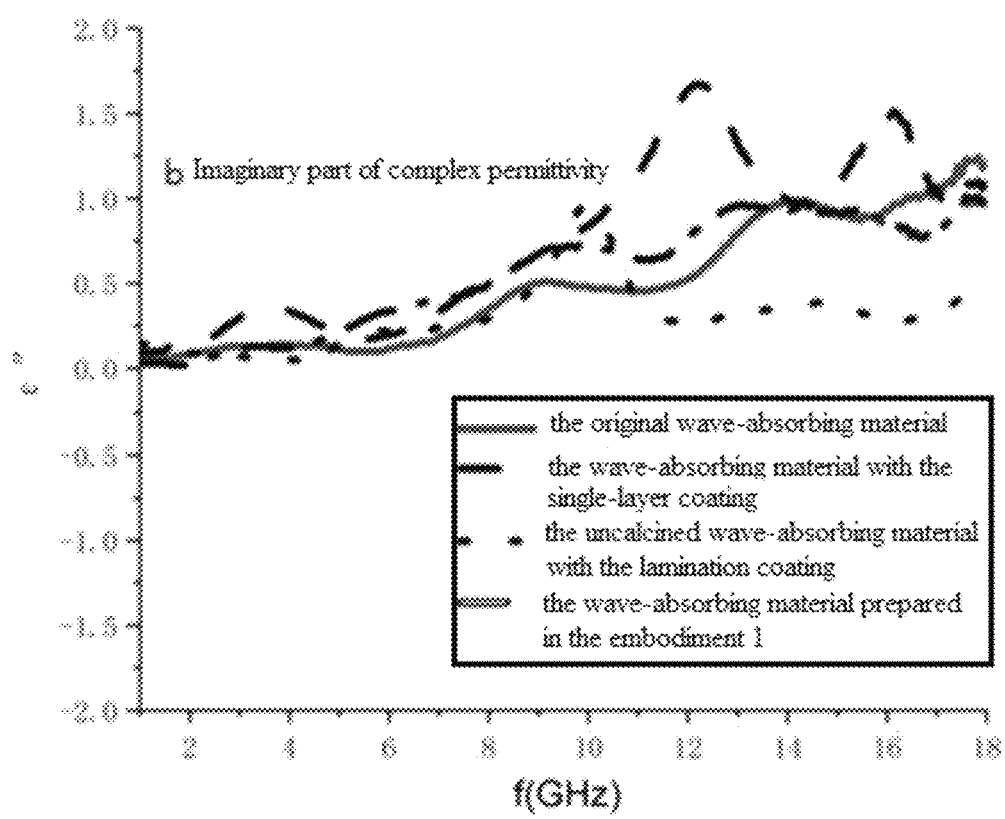
FIG. 9 is curve of imaginary parts of the electromagnetic parameter: the complex permittivity of the original powder, the absorbent with the single-layer coating, the uncalcined absorbent with the laminating coating, and the absorbent prepared in the embodiment 1.
Figure 10:
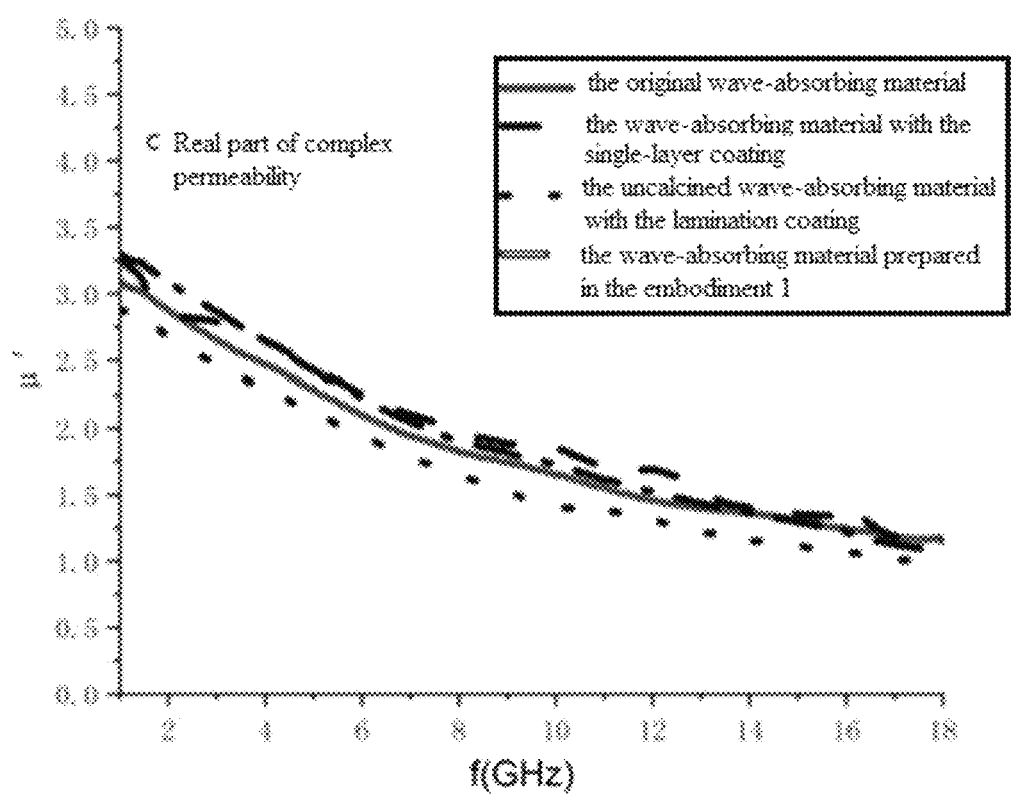
FIG. 10 is curve of real parts of the electromagnetic parameter: complex magnetic permeability of the original powder, the absorbent with the single-layer coating, the uncalcined absorbent with the laminating coating, and the absorbent prepared in the embodiment 1.
Figure 11:
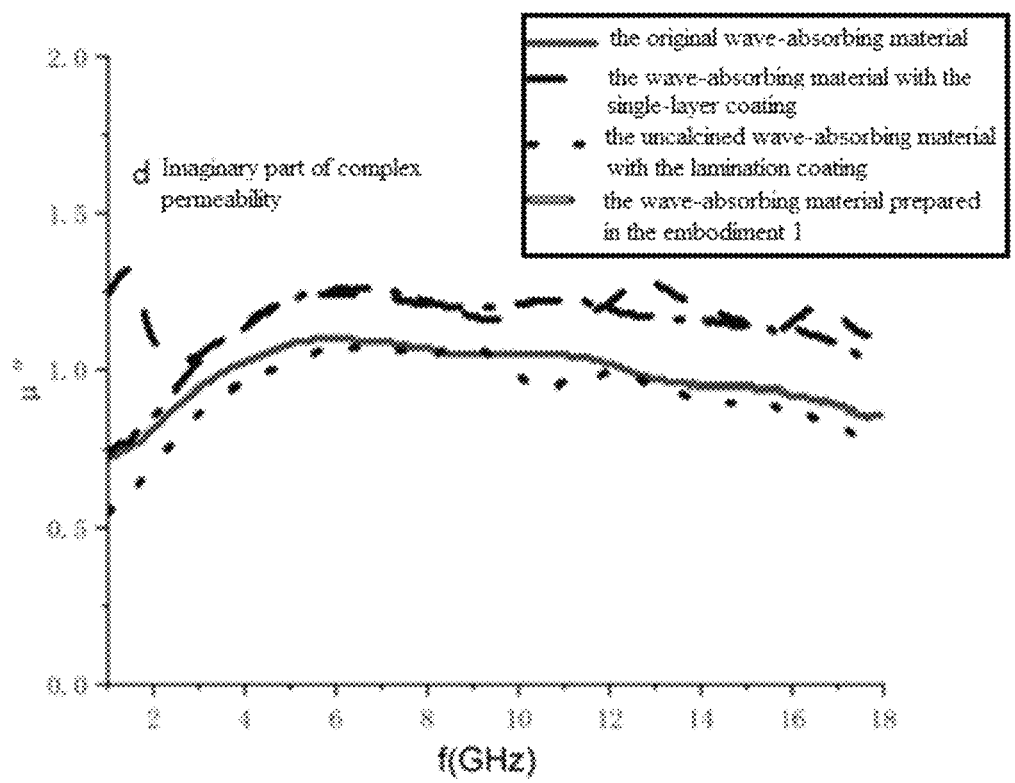
FIG. 11 is curve of imaginary parts of the electromagnetic parameter: the complex magnetic permeability of the original powder, the absorbent with the single-layer coating, the uncalcined absorbent with the laminating coating, and the absorbent prepared in the embodiment 1.
Figure 12:
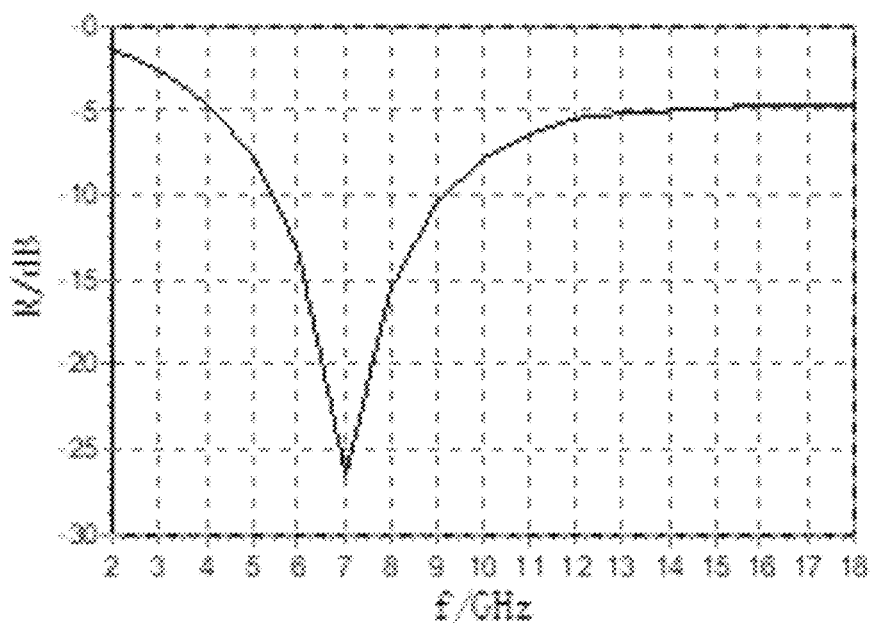
FIG. 12 illustrates a simulated reflectivity of the original powder.
Figure 13:
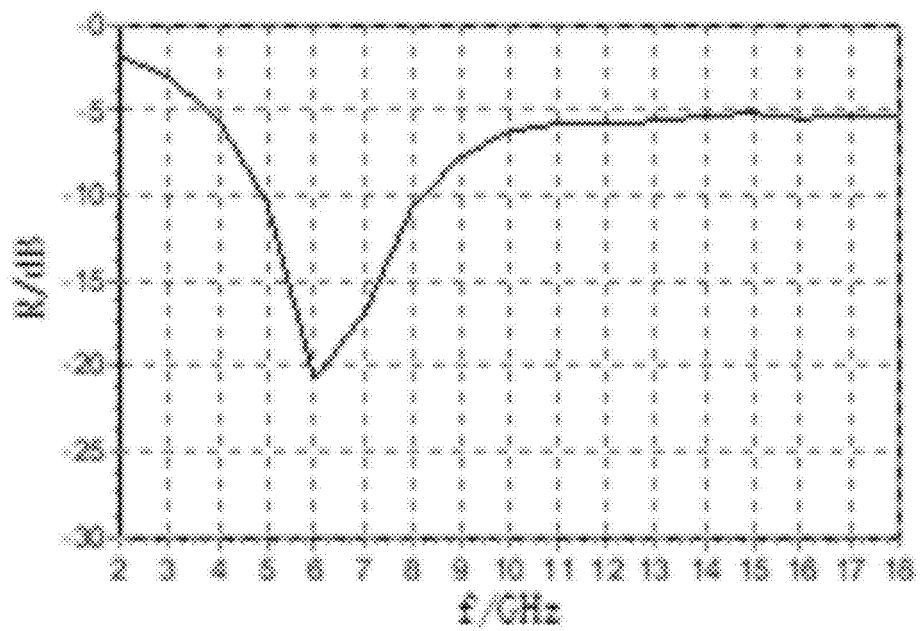
FIG. 13 illustrates a simulated reflectivity of $ZrO_2$ with a single-layer coating formed by atomic layer deposition.
Figure 14:
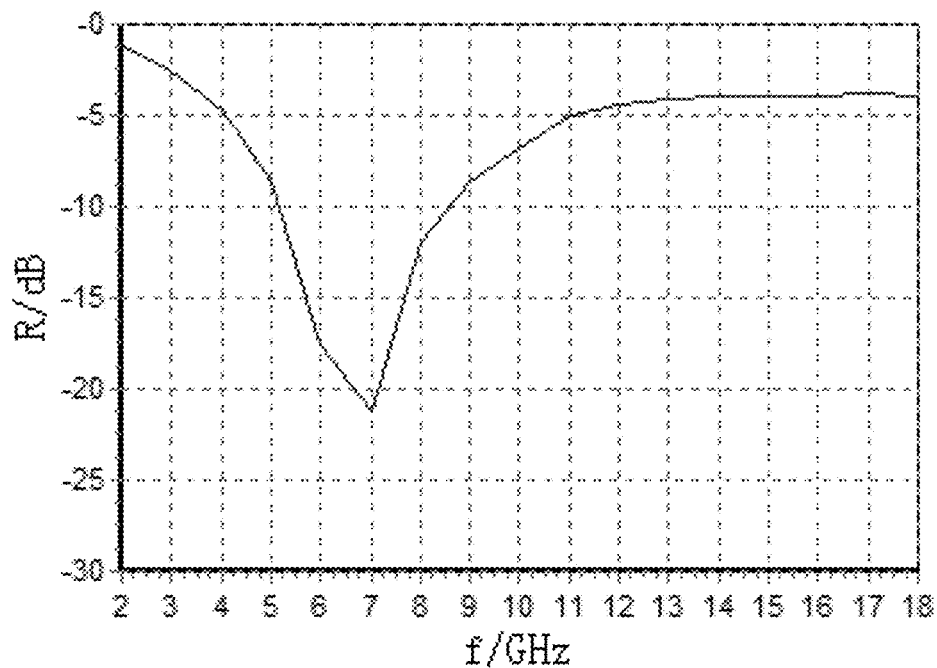
FIG. 14 illustrates a simulated reflectivity of the uncalcined absorbent with the laminating coating.
Figure 15:
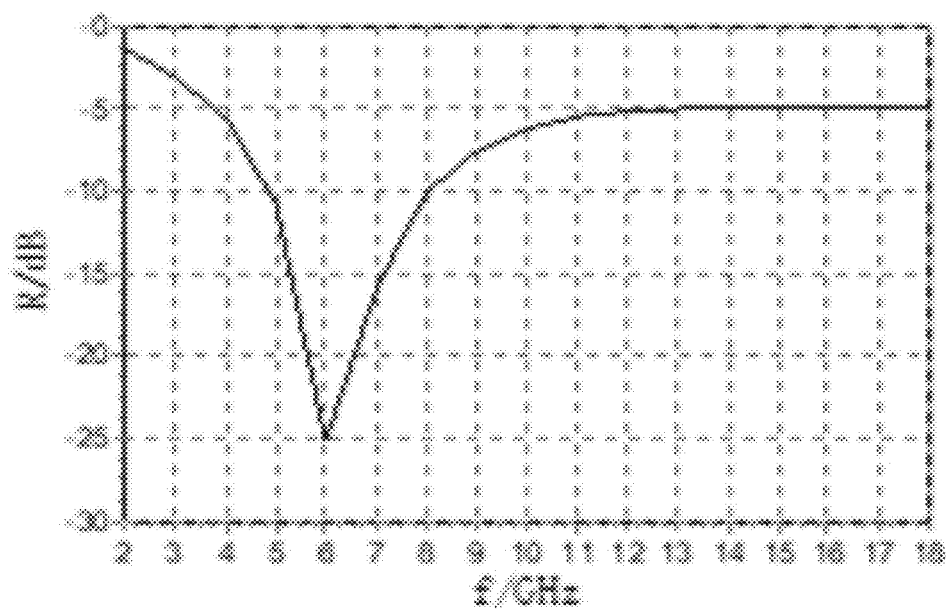
FIG. 15 illustrates a simulated reflectivity of the absorbent prepared in the embodiment 1.

As shown in FIG. 7, after the lamination coating of the present invention, the thermal oxidation temperature of the absorbing material increased to 781.9° C., and the anti-oxidation performance was significantly improved.

Figure 6:
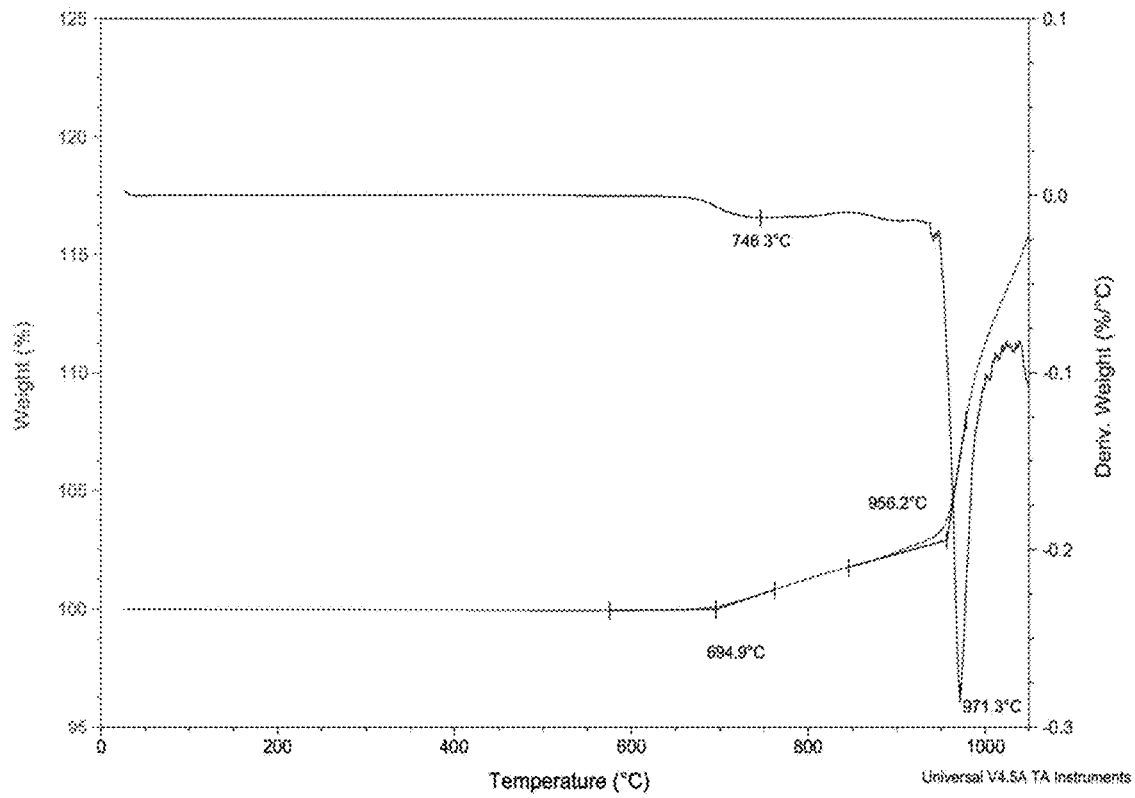
FIG. 6 is a TGA diagram of the absorbent with the single-layer coating (an oxidation temperature is 694.9° C.)

A coaxial method was used to test the electromagnetic parameters of the original wave-absorbing material, the wave-absorbing material with the single-layer coating, the uncalcined wave-absorbing material with the lamination coating, and the wave-absorbing material prepared in the embodiment 1. The results are shown in FIGS. 8-11, wherein the magnetic permeability of the wave-absorbing material without high-temperature annealing treatment is the lowest, indicating that the magnetic loss of the magnetic wave-absorbing material is directly affected by the lamination coating. The wave-absorbing material with only the metal oxide layer (the single-layer coating) has the highest magnetic permeability, but FIG. 6 shows that the anti-oxidation performance of the wave-absorbing material with the single-layer coating is weak, while the magnetic permeability of the wave-absorbing material prepared in the embodiment 1 is larger, indicating that such coating has little effect on the magnetic loss of the magnetic wave-absorbing material, while the dielectric constant increases significantly. That is to say, the electrical loss is enhanced, which is beneficial to the absorption of electromagnetic waves.

By simulating and calculating the electromagnetic absorption properties of the original wave-absorbing material, the wave-absorbing material with the single-layer coating, the uncalcined wave-absorbing material with the lamination coating, and the wave-absorbing material prepared in the embodiment 1, it is found that with the same wave-absorbing material content and the same thickness, the electromagnetic wave absorption peak of the coated and high-temperature-annealed wave-absorbing material moves to the low frequency, while the peak and valley are deeper, reflecting the radar absorption performance of the wave-absorbing material after stacking and coating of the embodiment 1 is improved. The reflectivity simulation results are shown in FIGS. 12-15.

In general, when the electromagnetic parameters of the material are fixed, and the reflectivity of the material can be adjusted by changing the thickness of the nano layer. When the thickness is fixed, the material should be redesigned to change the electromagnetic properties thereof, so as to adjust the reflectivity of the material.

In general, when the thickness of the nano layer is large, the absorption peak of the wave-absorbing material is located at the low frequency, and the absorption bandwidth becomes narrower. In addition, the wave-absorbing materials should not be prepared without purpose, but should combine specific project indicators to understand the required reflectivity of each frequency band, so as to design electromagnetic parameters and matching thickness.

In short, the wave-absorbing material is relatively complex, and the above parameters should be considered comprehensively during research. The reflectivity should be calculated based on the transmission line theory to find the optimal electromagnetic parameters and matching thickness.

What is claimed is:

1. A method for preparing wave-absorbing material powder with oxidation resistance and salt fog resistance, comprising steps of:

step 1: putting iron-containing wave-absorbing material powder into a porous container; wherein the wave-absorbing material comprises carbonyl iron, iron-silicon-aluminum, and iron-cobalt; and the iron-containing wave-absorbing material powder is particles, flakes or chopped fibers;

step 2: putting the porous container into an ALD (atomic layer deposition) reaction chamber; then repeatedly vacuumizing the ALD reaction chamber, and filling in the ALD reaction chamber with nitrogen gas at least three times;

step 3: using atomic layer deposition to coat the iron-containing wave-absorbing material powder with a metal oxide ceramic coating, wherein a non-oxygen element in the metal oxide ceramic coating is aluminum, hafnium, yttrium, zirconium, titanium, zinc or silicon;

step 4: repeating the step 3 until a predetermined coating thickness is deposited;

step 5: fluidizing the powder obtained from the step 4 under nitrogen or argon atmosphere, wherein a fluidization pressure is 1-1000 torr; or rotating the porous container to disperse the powder;

step 6: selecting a precursor according to a type of a metal phosphate coating, and setting parameters of the ALD reaction chamber as: a deposition temperature is 100° C.-400° C., and a deposition pressure is 0.01 torr-500 torr; wherein the precursor is volatile trimethylaluminum, $Ti(OEt)_4$, $Zr[N(CH_3)_2]_4$, or $Hf[N(CH_3)(C_2H_5)]_4$;

step 7: introducing precursor vapor of the precursor selected in the step 6 into the ALD reaction chamber with nitrogen or argon, and holding for 10-300 seconds;

step 8: purging the ALD reaction chamber with nitrogen or argon to remove residual precursor;

step 9: introducing dimethyl phosphate vapor into the ALD reaction chamber with nitrogen or argon, and holding for 10-300 seconds;

step 10: purging the ALD reaction chamber with nitrogen or argon to remove any excess dimethyl phosphate vapor oxygen source and by-products;

step 11: repeating the steps 5-10 until a predetermined thickness of the metal phosphate coating is deposited, wherein the metal phosphate coating is $AlPO_4$, $Ti_3(PO_4)_4$, $Zr(HPO_4)_2$, or $Hf_3(PO_4)_4$; and step 12: sintering the obtained powder at 600-900° C. under argon atmosphere.

2. The method, as recited in claim 1, further comprising a step between the step 11 and the step 12: repeating the steps 3-10 to form alternating nano-stack layers composed of the metal oxide ceramic coating and $AlPO_4$, $Ti_3(PO_4)_4$, $Zr(HPO_4)_2$, or $Hf_3(PO_4)_4$.

3. The method, as recited in claim 2, wherein the precursor in the step 3 is selected from a group consisting of volatile silicon ions, metal alkylamino salts, metal organic compounds, halides, alkoxides, and metal β-diketone complexes; and metal ions in the metal alkylamino salts, the metal organic compounds, the halides, the alkoxides, and the metal β-diketone complexes are aluminum, hafnium, yttrium, zirconium, titanium, and zinc ions.

4. The method, as recited in claim 3, wherein an oxygen source is water, hydrogen peroxide, oxygen, ozone, or atomic oxygen.

5. The method, as recited in claim 1, wherein the step 3 comprises specific steps of:

Step 31: fluidizing the iron-containing wave-absorbing material powder in nitrogen or argon atmosphere, wherein a fluidization pressure is 1-1000 torr; or rotating the porous container to disperse the iron-containing wave-absorbing material powder;

step 32: selecting a precursor according to a type of the metal oxide ceramic coating, and setting the parameters of the ALD reaction chamber as: the deposition temperature is 25° C.-400° C., and the deposition pressure is 0.01 torr-500 torr;

step 33: introducing precursor vapor of the precursor selected in the step 32 into the ALD reaction chamber with nitrogen or argon, and holding for 10-300 seconds;

step 34: purging the ALD reaction chamber with nitrogen or argon to remove residual precursor;

step 35: introducing oxygen source vapor into the ALD reaction chamber with nitrogen or argon, and holding for 10-300 seconds; and step 36: purging the ALD reaction chamber with nitrogen or argon to remove an excess oxygen source and by-products.

6. The method, as recited in claim 5, wherein the precursor in the step 3 is selected from a group consisting of volatile silicon ions, metal alkylamino salts, metal organic compounds, halides, alkoxides, and metal β-diketone complexes; and metal ions in the metal alkylamino salts, the metal organic compounds, the halides, the alkoxides, and the metal β-diketone complexes are aluminum, hafnium, yttrium, zirconium, titanium, and zinc ions.

7. The method, as recited in claim 6, wherein the oxygen source is water, hydrogen peroxide, oxygen, ozone, or atomic oxygen.

8. The method, as recited in claim 5, wherein a carrying gas flow rate in the step 33 and the step 35 is 5-8000 sccm; and a purging gas flow rate in the step 34 and the step 36 is 10-5000 sccm.

9. The method, as recited in claim 5, wherein the fluidization pressure in the step 3 and the step 5 is 10-100 torr.

10. The method, as recited in claim 1, wherein the precursor in the step 3 is selected from a group consisting of volatile silicon ions, metal alkylamino salts, metal organic compounds, halides, alkoxides, and metal β-diketone complexes; and metal ions in the metal alkylamino salts, the metal organic compounds, the halides, the alkoxides, and the metal β-diketone complexes are aluminum, hafnium, yttrium, zirconium, titanium, and zinc ions.

11. The method, as recited in claim 10, wherein an oxygen source is water, hydrogen peroxide, oxygen, ozone, or atomic oxygen.

12. The method, as recited in claim 1, wherein a carrying gas flow rate in the step 7 and the step 9 is 5-8000 sccm; and a purging gas flow rate in the step 8 and the step 9 is 10-5000 sccm.

* * * * *